United States Patent [19]
Barker et al.

[11] Patent Number: 6,067,226
[45] Date of Patent: *May 23, 2000

[54] APPARATUS FOR INCREASING THE NUMBER OF INPUT/OUTPUT PORTS WHILE MAINTAINING THE FORM FACTOR OF AN ASSOCIATED COMPUTER CHASSIS

[75] Inventors: John C. Barker, Houston; William H. Ellis, The Woodlands; James P. Sauer, Houston, all of Tex.

[73] Assignee: Compaq Computer Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/940,277

[22] Filed: Sep. 30, 1997

[51] Int. Cl.⁷ .................................. G06F 1/16; H05K 7/04
[52] U.S. Cl. .......................... 361/686; 361/683; 361/684; 361/788; 439/61
[58] Field of Search ...................... 361/683, 684, 361/686, 796, 803, 785, 788; 439/61, 64, 65, 74

[56] References Cited

U.S. PATENT DOCUMENTS

| | | | |
|---|---|---|---|
| 5,235,493 | 8/1993 | Yu | 361/685 |
| 5,253,246 | 10/1993 | Leonhardt et al. | 369/291 |
| 5,338,214 | 8/1994 | Steffes et al. | 439/160 |
| 5,438,476 | 8/1995 | Steffes | 361/683 |
| 5,450,285 | 9/1995 | Schlemmer | 361/724 |
| 5,513,329 | 4/1996 | Pecone | 395/281 |
| 5,519,573 | 5/1996 | Cobb et al. | 361/686 |
| 5,536,178 | 7/1996 | Novelli | 439/74 |
| 5,572,400 | 11/1996 | Roesner et al. | 361/683 |
| 5,594,621 | 1/1997 | Van Rumpt | 361/686 |
| 5,605,463 | 2/1997 | MacGregor et al. | 439/64 |
| 5,621,612 | 4/1997 | Dahmen | 361/683 |
| 5,650,911 | 7/1997 | Scholder et al. | 361/684 |
| 5,793,616 | 8/1998 | Aubuchon et al. | 361/784 |

*Primary Examiner*—Benjamin R. Fuller
*Assistant Examiner*—Jagdish Patel
*Attorney, Agent, or Firm*—Jenkens & Gilchrist, a Professional Corporation

[57] ABSTRACT

An apparatus for increasing the number of input/output ports of a computer system while maintaining the form factor of the computer chassis is disclosed. The apparatus includes a first system or motherboard mounted within the computer chassis. The first edge of a riser board is connected to the motherboard such the riser board extends generally perpendicular to the motherboard. The second edge of the riser board is connected to a second system board. The second system board is mounted to a sub panel and includes multiple input/output connectors positioned at both the front of the chassis and the rear of the chassis. A front bezel, having openings corresponding to the input/output connectors, is placed over the front of the chassis.

14 Claims, 3 Drawing Sheets

APPARATUS FOR INCREASING THE NUMBER OF INPUT/OUTPUT PORTS WHILE MAINTAINING THE FORM FACTOR OF AN ASSOCIATED COMPUTER CHASSIS

FIELD OF THE INVENTION

The present invention relates to computers, and more particularly, but not by way of limitation, to an assembly for increasing the number of readily accessible input/output ports of a computer system while maintaining an existing form factor of the computer chassis.

BACKGROUND OF THE INVENTION

The computer industry is a very competitive and rapidly changing industry. In order for a computer manufacturer to be successful, it must be able to continuously introduce new products to the market at a competitive cost.

In the design and manufacture of new computer systems, particularly of the personal computer ("PC") type, there is great pressure to efficiently utilize the space or volume within existing computer chassis, i.e., to maintain the form factor of an existing chassis. This permits the accommodation of a broad range of electronics and additional features within a personal computer without the increased expense of designing, tooling and producing a new computer chassis for each computer system improvement.

An example of a design effort to expand the functions of a personal computer is the PC/TV convergence device. The PC/TV convergence device is a computer system having video/television capability converged therein, so that one computer system may be used as a computer and as a television/video set.

Stated another way, PC/TV convergence device is a fully functional computer which also emulates a television, providing TV viewing (via broadcast, cable, Digital Satellite, or other broadcast media) and personal computing functionality. This convergence of computer and television provides a user with combined access to both television program information and computer functionalities.

Typically, a PC/TV convergence device consists of a fully functional computer including fax/modems, CD-ROM or DVD players, and media storage devices such as hard drives and floppy drives. The computer is interfaced with a video monitor, often a big screen television, with the television's NTSC interlaced signal being converted to a scan VGA signal or the computer's scan VGA signal being converted to an NTSC interlaced signal. Because the PC/TV convergence device is controlled by the computer's operating system, the PC/TV convergence device can, among other things, display PC applications and TV programs on a single monitor. The convergence of the personal computer and the television into a single device also permits the utilization of the communications bandwidth, mass storage and graphics of the computer to deliver, store and display applications during a traditional television viewing environment. The PC/TV convergence device also changes a typical television experience from just a passive viewing device to a user interactive device.

One of the problems encountered with increasing the functionalities of the computer system, such as with a PC/TV convergence device, is that the computer manufacture has to increase the number, types and shapes of external connections available on each computer system to accommodate for the added functionality. Because each external connector requires a corresponding access opening in the computer chassis, there is limited connector panel space on existing standard PC chassis for many of the new computer system connector requirements.

Accordingly, it is desirable to provide a computer system that includes a chassis with an assembly that can handle multiple input/outputs for use in a broad range of computer systems and yet maintain the chassis form factor to keep production costs at a minimum.

SUMMARY OF THE INVENTION

The present invention overcomes the above identified problems as well as other shortcomings and deficiencies of existing technologies by providing an assembly for a computer system that maintains the existing form factor of the computer chassis of the computer system and further increases the number of readily accessible input/output ports of the computer system.

The present invention further provides an apparatus for increasing the number of input/output ports of a computer system while maintaining the form factor of the computer chassis. The apparatus includes a first system or motherboard mounted within the computer chassis. The first edge of a riser board is connected to the motherboard such the riser board extends generally perpendicular to the motherboard. The second edge of the riser board is connected to a second system board. The second system board is mounted to a sub panel and includes multiple input/output connectors positioned at both the front of the chassis and the rear of the chassis. A front bezel, having openings corresponding to the input/output connectors, is placed over the front of the chassis and provides access to the input/output connectors at the front of the chassis.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
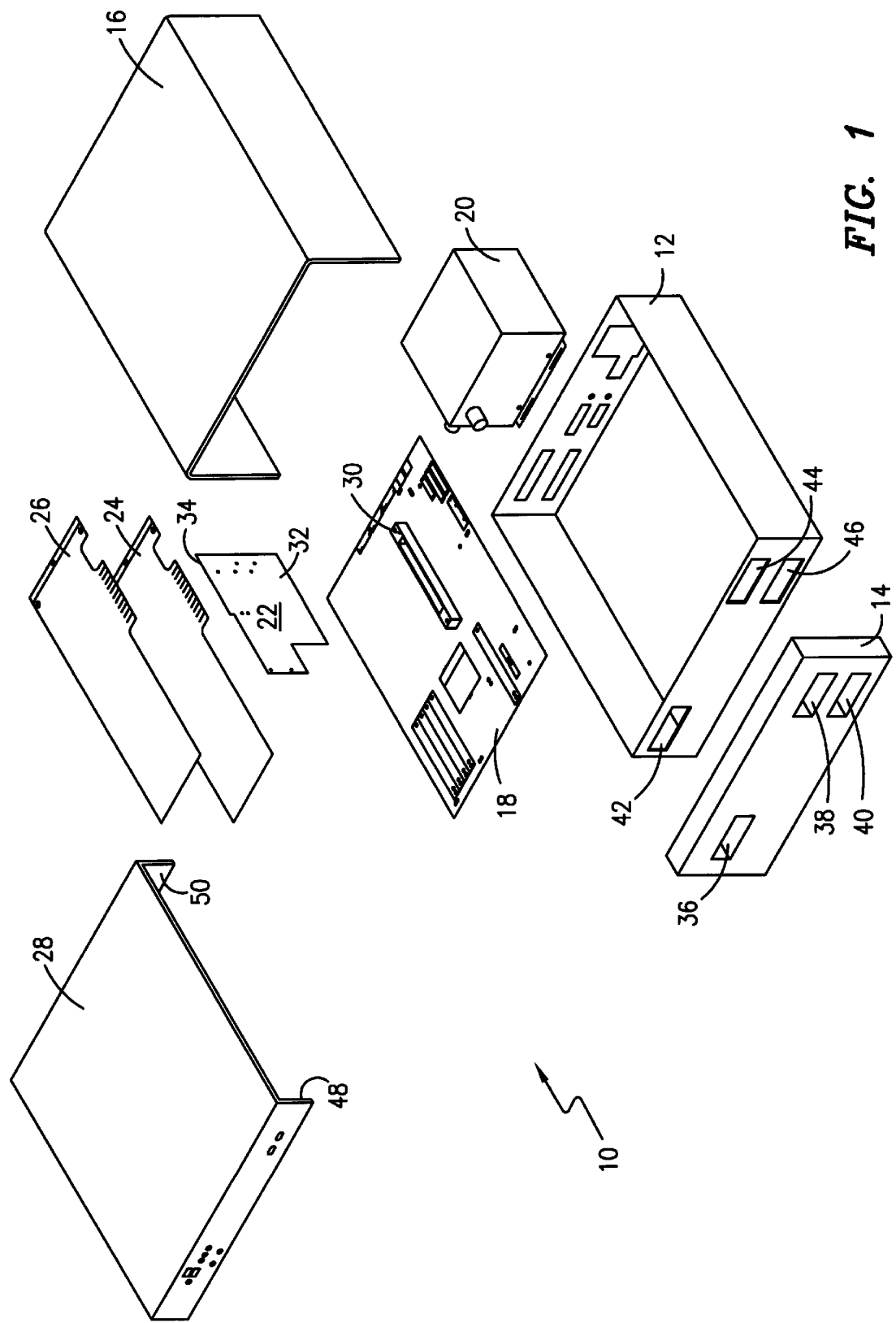
FIG. 1 is an exploded perspective view of a computer chassis utilizing the present invention.

Referring now to the drawings wherein like or similar elements are designated with identical reference numerals throughout the several views, and wherein the various elements depicted are not necessarily drawn to scale, and in particular, to FIG. 1, there is shown an exploded perspective view of a PC/TV convergence computer system 10 constructed in accordance with the principles of the present invention. As illustrated, computer system 10 includes a standard form factor chassis 12, a front bezel 14, a top cover panel or hood 16, and modular components which include a system motherboard 18, a power supply 20, a riser card 22, peripheral expansion cards 24 and 26 and a sub panel 28.

As depicted in FIG. 1, motherboard 18 includes a female type connector 30 for receiving riser card 22 therein. Front bezel 14 includes openings 36, 38 and 40 for providing access to certain accessories within chassis 12. As further depicted, chassis 12 includes openings 42, 44, and 46 which correspond to the openings 36, 38 and 40 of front bezel 14. Sub panel 28 includes a front edge 48 and a rear edge 50, each of which contain multiple input/output connectors (see FIGS. 2–5).

Still referring to FIG. 1, the general assembly of computer system 10 includes placing the system motherboard 18 and power supply within chassis 12. The lower edge 32 of riser card 22 is inserted into connector 30 of motherboard 18. Peripheral cards 24 and 26 are connected to riser 22 (see FIG. 6), while edge 34 of riser card 34 is connected to sub panel 28 (see FIG. 6). Accessories within chassis 12 are accessible through openings 36, 38 and 40 of bezel 14, which is attached to the front of chassis 12. Hood 16 is then placed over sub panel 28 to finish the assembly thereof.

Figure 2:
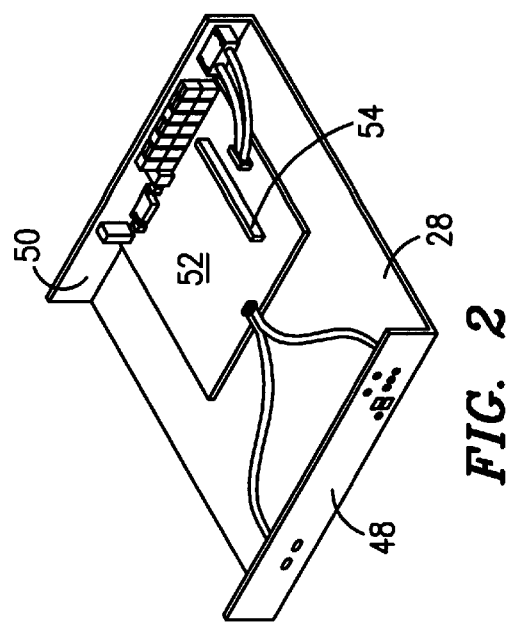
FIG. 2 is a perspective view of the bottom of the sub panel in accordance with the principles of the present invention.

Referring now to FIG. 2, there is illustrated a perspective bottom view of sub panel 28. As depicted, a system board 52 is mounted to the underside of sub panel 28. System board 52 includes a female connector 54 which receives edge 34 of riser card 22 thereby electrically connecting system board 28 with motherboard 18.

Figure 3:
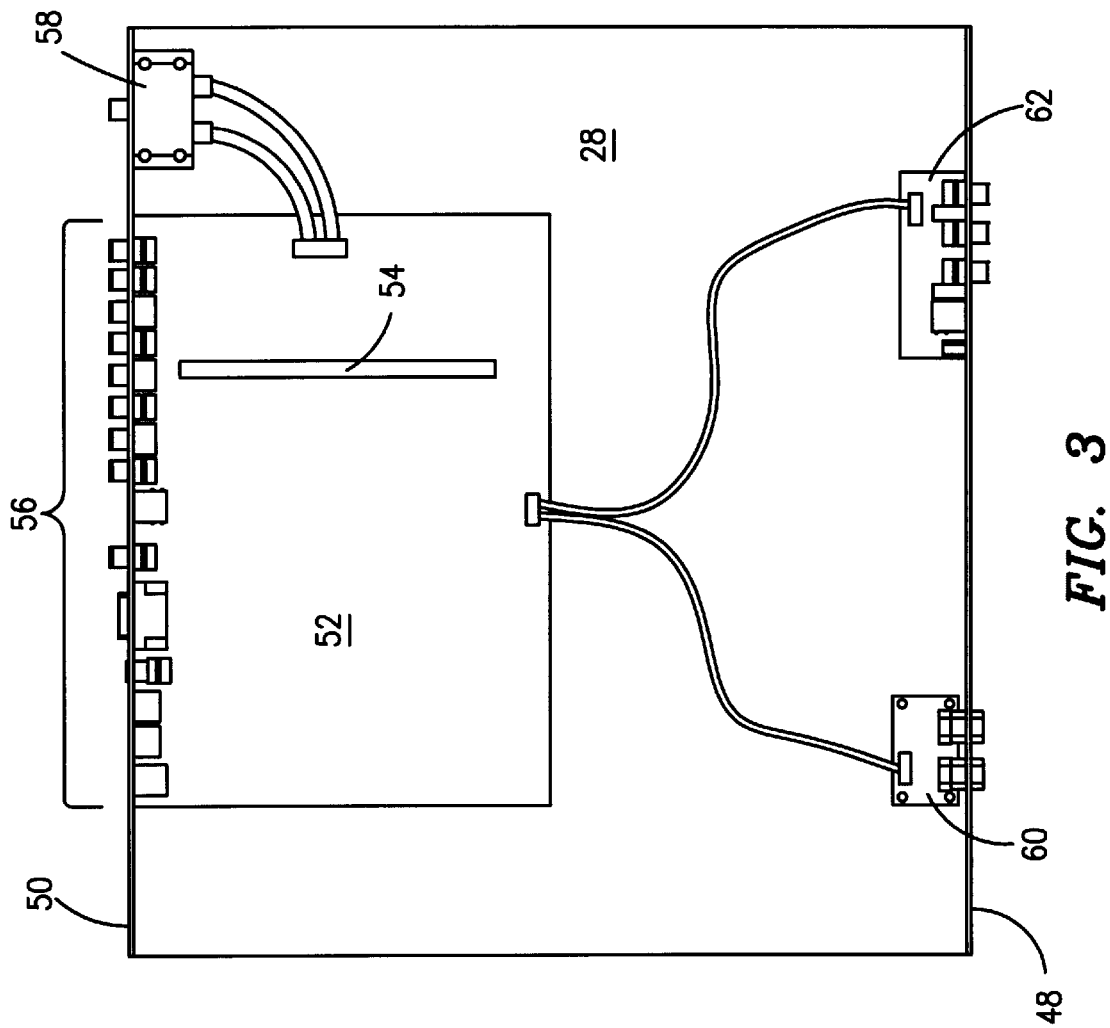
FIG. 3 is bottom planar view of the sub panel as similarly shown in FIG. 2.

Referring now to FIG. 3, there is illustrated a bottom view of sub panel 28. As is depicted, multiple input/output connectors such as connectors 56 and 58, as well as the input/output connectors connected to panels 56, 58, 60 and 62, are all electrically connected to system board 52.

Figure 4:
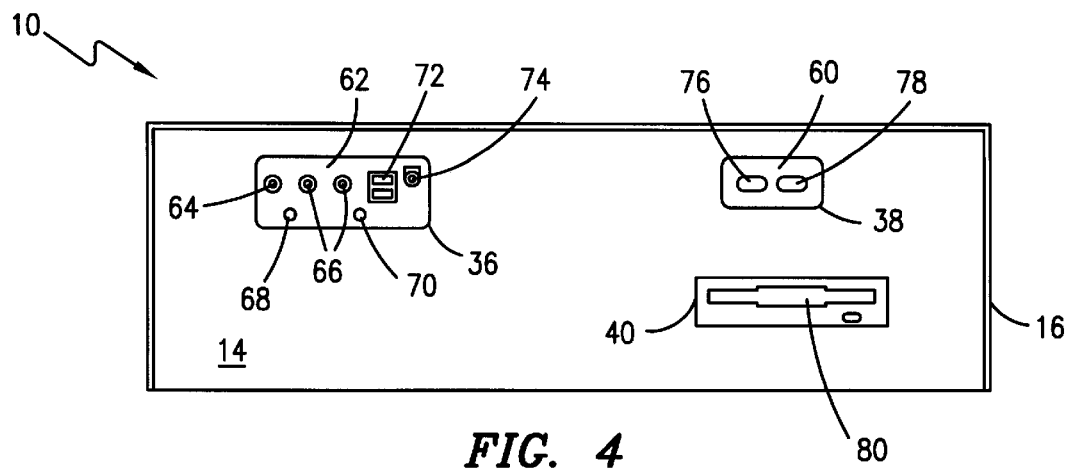
FIG. 4 is a front planar view of a computer chassis utilizing the present invention.

Referring now to FIG. 4, there is illustrated a frontal plane view of an embodiment of computer system 10 fully assembled. As depicted, panel 62 includes a video connector 64, left and right audio connectors 66, USB connector 72 and a microphone connector 74. A status indicator 68 as well as a power indicator 70 are also connected to panel 62. The connectors of connector panel 62 are accessible through opening 36 of front bezel 14. Similarly, panel 60 includes a power switch 76 and a reset switch 78, each being accessible through opening 38 of front bezel 14. As further depicted in FIG. 4, a disk drive 80 is accessible through opening 40 of front bezel 14.

Figure 5:
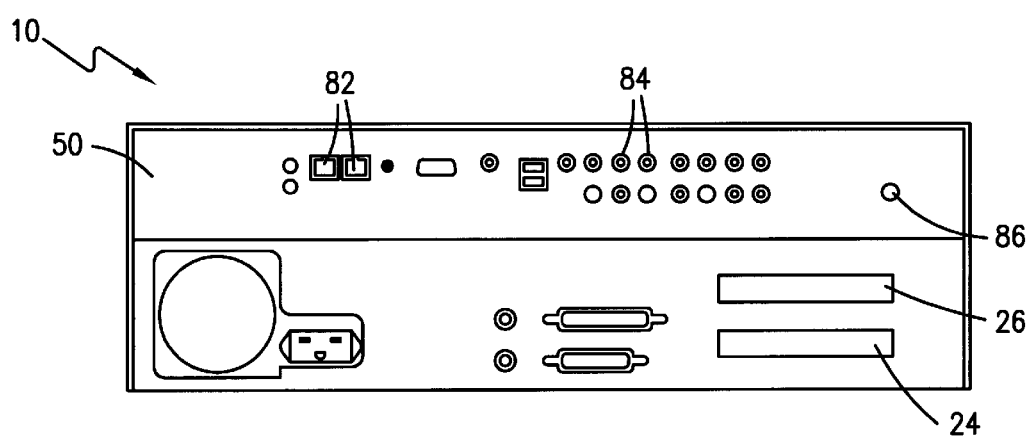
FIG. 5 is a rear planar view of a computer chassis utilizing the present invention.

Referring now to FIG. 5, there is illustrated a rear plane view of computer system 10. As depicted, rear edge 50 of sub panel 28 includes multiple connectors such as phone jack connectors 82 for an internal fax/modem, and multiple audio/visual connectors such as connectors 84. A cable antenna connector 86 is also provided.

Figure 6:
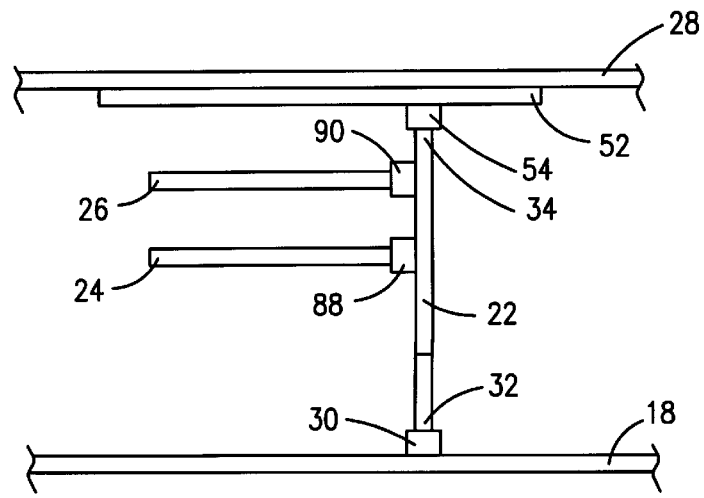
FIG. 6 is partial plane view illustrating the connections of the riser board with the two system boards in accordance with the principles of the present invention.

Referring now to FIG. 6, there is illustrated a partial front plane view of the system assembly of the present invention. As depicted, the riser card 22 is connected to motherboard 18 by inserting edge 32 into connector 30. This provides the electrical connection between riser 22 and motherboard 18. As further depicted, riser card 22 includes connectors 88 and 90 for receiving expansion cards 24 and 26 respectively. Connectors 88 and 90 provide the electrical connection between expansion cards 24, 26 and the riser card 22. As further depicted, edge 34 of riser card 22 is inserted into connector 54 of system board 52. Connector 54 provides the electrical connection between riser card 22 and system card 52.

As can be appreciated, the present invention provides a number of advantages over existing computer system. Multiple input/output connectors are accessible at both the front and the rear of the computer system. The modularity of the sub panel 28 and system board 52 permit the addition of the additional input/output connectors which maintaining the form factor of the standard computer chassis. This prevents the added expense of redesigning and retooling of the chassis. As there are often different requirements in different computer models, the modular design also permits varying designs by only changing sub panel 28 and system board 52. It further facilitates ease in servicing, upgrading or changing out system board 52 or other peripheral expansion cards with minimal effort.

Although good results have been achieved in utilizing the present invention in a PC/TV convergence computer system, it is contemplated to be within the scope of this invention that the present invention could be implemented in virtually any type of computer system.

Therefore, as can be appreciated, the present invention provides a modular assembly for increasing the number of input/output ports of a computer system while maintaining the form factor of the computer chassis. The apparatus includes a first system or motherboard mounted within the computer chassis. The first edge of a riser board is connected to the motherboard so that the riser board extends generally perpendicular to the motherboard. The second edge of the riser board is connected a second system board. The second system board is mounted to a sub panel and includes multiple input/output connectors positioned at both the front of the chassis and the rear of the chassis. A front bezel, having openings corresponding to the input/output connectors, is placed over the front of the chassis.

Although a preferred embodiment of the apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. The computer convergence device comprising:

a chassis having an inside, a bottom, a front side, a back side and a cover;

a first system board mounted inside said chassis on the bottom;

a modular subpanel having a front edge and a rear edge, said modular subpanel including a front panel extending from said front edge and further including a rear panel extending from said rear edge, said modular subpanel positioned inside the cover of said chassis;

a second system board mounted to a bottom side of said modular subpanel;

a plurality of input/output connectors coupled to said second system board with at least a first of said plurality of said input/output connectors mounted to said front panel of said modular subpanel and at least a second of said plurality of said input/output connectors mounted to said rear panel of said modular subpanel; and at least one riser board having a first end and a second end, said at least one riser board connected at said first end to a top side of said first system board and extending generally perpendicular therefrom, said at least one riser board further connected at said second end to said second system board and extending generally perpendicular therefrom.

2. The computer convergence device as recited in claim 1, wherein said at least one riser board includes at least one mounting connector for receiving an expansion board.

3. The computer convergence device as recited in claim 1, and further comprising a bezel for placement over said front panel of said modular subpanel, said bezel having at least one opening extending therethrough, the position of said opening corresponding to said first of said plurality of said input/output connectors mounted to said front panel of said modular subpanel.

4. An apparatus for increasing the number of input/output ports of a computer system while maintaining the form factor of an associated computer chassis, said apparatus comprising:

a first system board mounted in and horizontally on a bottom of the computer chassis;

a modular subpanel having a front edge and a rear edge, said modular subpanel including a front panel extending from said front edge and further including a rear panel extending from said rear edge, said modular subpanel positioned in and horizontally on a top of said computer chassis;

a second system board mounted to a bottom side of said modular subpanel;

a first plurality of input/output connectors mounted to said front panel of said modular subpanel, each of said first plurality of input/output connectors coupled to said second system board;

a second plurality of input/output of connectors mounted to said rear panel of said modular subpanel, each of said second plurality of input/output connectors coupled to said second system board; and at least one riser board having a first end and a second end, said at least one riser board connected at said first end to said first system board and extending generally perpendicular therefrom, said at least one riser board further connected at said second end to a bottom side of said second system board and extending generally perpendicular therefrom.

5. The apparatus as recited in claim 4, and further comprising a bezel for placement over said front panel of said modular subpanel, said bezel having at least one opening extending therethrough, the position of said opening corresponding to said first plurality of said input/output connectors mounted to said front panel of said modular subpanel.

6. The apparatus as recited in claim 5, wherein said at least one riser board includes at least one mounting connector for receiving an expansion board.

7. The apparatus as recited in claim 5, wherein said at least one riser board includes a plurality of mounting connectors, each of said plurality of mounting connectors for receiving an expansion board.

8. A computer system comprising:

a chassis;

a first system board mounted horizontally within and on a bottom of said chassis;

a removable sub panel having a front edge and a rear edge, said removable sub panel including a front panel extending from said front edge and further including a rear panel extending from said rear edge, said removable sub panel mounted horzontally within and on a top of said chassis;

a second system board mounted to a bottom side of said removable sub panel;

a first plurality of input/output connectors mounted to said front panel of said removable sub panel, each of said first plurality of input/output connectors coupled to said second system board;

a second plurality of input/output of connectors mounted to said rear panel of said removable sub panel, each of said second plurality of input/output connectors coupled to said second system board; and at least one riser board having a first end and a second end, said at least one riser board connected generally perpendicular at said first end to a top side of said first system board, said at least one riser board further connected generally perpendicular at said second end to a bottom side of said second system board.

9. The computer system as recited in claim 8, and further comprising a bezel for placement over said front panel of said removable sub panel, said bezel having at least one opening extending therethrough, the position of said opening corresponding to said first plurality of said input/output connectors mounted to said front panel of said removable sub panel.

10. The computer system as recited in claim 8, wherein said at least one riser board includes at least one mounting connector for receiving an expansion board.

11. The computer system as recited in claim 8, wherein said at least one riser board includes a plurality of mounting connectors, each of said plurality of mounting connectors for receiving an expansion board.

12. The computer system as recited in claim 11, wherein each of said plurality of mounting connectors includes a female edge connector.

13. The computer system as recited in claim 12, wherein said first system board includes a female edge connector for receiving said first end of said at least one riser board.

14. The computer system as recited in claim 8, wherein said second system board includes a female edge connector for receiving said second end of said at least one riser board.

\* \* \* \* \*